United States Patent [19]
Benjamin et al.

[11] Patent Number: 5,708,250
[45] Date of Patent: Jan. 13, 1998

[54] VOLTAGE CONTROLLER FOR ELECTROSTATIC CHUCK OF VACUUM PLASMA PROCESSORS

[75] Inventors: Neil Benjamin, East Palo Alto; Seyed Jafar Jafarian-Tehrani, Fremont; Max Artusy, Saratoga, all of Calif.

[73] Assignee: Lam Resarch Corporation, Fremont, Calif.

[21] Appl. No.: 623,774

[22] Filed: Mar. 29, 1996

[51] Int. Cl.⁶ .................... B23K 10/00; H02N 13/00
[52] U.S. Cl. .................... 219/121.58; 219/121.54; 219/121.43; 361/234; 156/345; 269/903
[58] Field of Search .................... 219/121.43, 121.58, 219/121.54; 361/233, 234; 156/345, 646.1; 315/111.31, 111.41; 269/903

[56] References Cited

U.S. PATENT DOCUMENTS

| | | |
|---|---|---|
| 4,184,188 | 1/1980 | Briglia . |
| 4,384,918 | 5/1983 | Abe . |
| 4,480,284 | 10/1984 | Tojo et al. . |
| 4,502,094 | 2/1985 | Lewin et al. . |
| 4,692,836 | 9/1987 | Suzuki . |
| 4,724,510 | 2/1988 | Wicker et al. . |
| 5,110,438 | 5/1992 | Ohmi et al. .................... 204/298.34 |
| 5,557,215 | 9/1996 | Saeki et al. .................... 324/765 |
| 5,605,637 | 2/1997 | Shan et al. .................... 216/71 |

Primary Examiner—Mark H. Paschall
Attorney, Agent, or Firm—Lowe, Price, LeBlanc & Becker

[57] ABSTRACT

An r.f. excited vacuum plasma processor has a workpiece held in place by a monopolar or bipolar electrostatic chuck having an electrode that develops peak r.f. voltages over a wide amplitude range. A chuck DC power supply source is connected to the chuck. An r.f. peak detecting circuit coupled with the electrode is part of a circuit for controlling the DC voltage applied by the chuck power supply to the chuck. The control circuit supplies an unamplified replica of a DC voltage derived by the peak detecting circuit to the chuck DC power supply source via a DC circuit including only passive elements so the level of the DC voltage applied to the chuck varies in response to variations in the peak amplitude of the r.f. voltage. The peak detector includes at least several series connected diodes having electrodes polarized in the same direction or two stacks of series connected diodes. In one of the stacks, the diode electrodes are polarized in one direction and in the other stack the diode electrodes are polarized in the other direction. The diodes of the peak detecting circuit are arranged so the DC bias voltage supplied to the chuck and the peak value of the r.f. voltage developed at the electrode have the same order of magnitude.

21 Claims, 5 Drawing Sheets

VOLTAGE CONTROLLER FOR ELECTROSTATIC CHUCK OF VACUUM PLASMA PROCESSORS

FIELD OF INVENTION

The present invention relates generally to r.f. excited vacuum plasma processors for processing workpieces and more particularly to a control circuit for electrostatic chucks of such processors wherein the control circuit derives a DC voltage proportional to an r.f. peak voltage of an electrode of the chuck and an unamplified replica of the DC voltage controls a DC power supply voltage applied to a chuck electrode. Another aspect of the invention relates to an r.f. peak detector having at least several series connected diodes in a control circuit for a DC power supply voltage of an electrostatic chuck of such processors. A further aspect of the invention relates to such a processor having a DC connection including only passive elements between an r.f. peak detector and a DC power supply circuit for an electrostatic chuck.

BACKGROUND ART

Vacuum plasma processors include a vacuum chamber containing a workpiece holder, i.e., chuck, for holding in place a workpiece having an exposed surface which is etched and/or on which materials are deposited. The etching and depositing are provided inter alia by ions in a plasma formed in the chamber. The plasma is formed by applying an r.f. field to a gas introduced into the chamber.

The workpiece temperature is usually controlled by applying an inert gas, such as helium, to a back face of the workpiece, i.e. the face of the workpiece clamped to the chuck and not exposed to the plasma. Typically, the workpieces are relatively thin substrate plates made of electrical conducting materials (i.e., metals), semiconductors or dielectrics. To hold such a workpiece in place against the pressure of the gas pushing on the back face of the workpiece, the workpiece must be clamped to the chuck.

Electrostatic chucks have been successfully used in the prior art to hold semiconducting, conducting, and dielectric substrate workpieces in place in vacuum processing chambers. Exemplary of a wide range of designs employing electrostatic chucks for this purpose are found in Tojo et al., U.S. Pat. No. 4,480,284, Suzuki, U.S. Pat. No. 4,692,836, Lewin et al., U.S. Pat. No. 4,502,094, Wicker et al., U.S. Pat. No. 4,724,510, Abe, U.S. Pat. No. 4,384,918 and Briglia, U.S. Pat. No. 4,184,188, and commonly assigned and co-pending U.S. application Ser. No. 08/536,923, filed Sep. 29, 1995.

These prior art electrostatic chucks are classified as either bipolar or monopolar. One type of bipolar electrostatic chuck includes a further electrode, sometimes referred to as a bias electrode. Bipolar chucks usually are used for semiconductor or metal workpieces.

A bipolar electrostatic chuck includes two mutually insulated electrodes across which a DC voltage is established. In addition, an r.f. bias voltage is applied to one of the electrodes by a suitable r.f. source. A solid dielectric is interposed between a top surface of the electrodes and a conductive or semiconductor workpiece. The electrodes establish electrostatic forces that clamp the workpiece in place to overcome the effects of the temperature controlling inert gas pushing on the back face of the workpiece.

In contrast, monopolar electrostatic clamps include only one electrode. If the workpiece is an electrical conductor or a semiconductor, a solid dielectric is interposed between a top surface of the electrostatic chuck electrode and the workpiece. An electrostatic charge is established from the chuck electrode surface through the solid dielectric to the workpiece by virtue of charge being established on the workpiece by ions in the plasma. If the workpiece is a dielectric, the dielectric may be placed directly on the monopolar electrode or on the interposed dielectric and an electrostatic force is established from the electrode to charge established on a surface of the dielectric workpiece remote from the chuck electrode surface. The charge is established on the workpiece by ions in the plasma.

A typical prior art r.f. excited vacuum processing chamber including a bipolar electrostatic chuck is illustrated in FIG. 1 as including vacuum plasma processing chamber 10 evacuated through port 12 by vacuum pump 14. Chamber 10 has electrically grounded metal walls. Gas to be ionized is supplied to chamber 10 by source 16, connected to shower head 18 in chamber 10 by conduit 20. The gas flowing from shower head 18 is excited to an r.f. plasma condition by an r.f. electromagnetic field derived from coil 22, in turn excited by r.f. source 24 via matching network 26.

The plasma thereby established in chamber 10 is applied to workpiece 28, which can be any of a conducting, semiconductor or dielectric element. Typically, workpiece 28 is relatively thin, such as a semiconductor wafer, a thin metal sheet, or a dielectric sheet. Workpiece 28 is either etched by the ions in the r.f. plasma excited in chamber 10 or has material deposited on it by the plasma in the chamber.

The face of workpiece 28 which is not exposed to ions in the r.f. plasma in chamber 10, i.e. the back face of the workpiece, is clamped in place and cooled by electrostatic chuck 30. Chuck 30, being of the bipolar type, includes disc shaped electrode 32 and ring electrode 34 that is located in electrode 32. Electrodes 32 and 34 are electrically insulated from each other by insulating material 36. Top coplanar faces of electrodes 32 and 34 abut a bottom face of dielectric coating 38, having a top face contacted by the bottom face of workpiece 28, i.e., the face of the workpiece which is not exposed to the plasma in chamber 10. Gas from helium source 40 cools the back face of workpiece 28 by virtue of source 40 being connected via conduit 44 to plenum 42 in chuck 30. If the electrostatic clamp is of the monopolar type (not shown), ring electrode 34 and insulator 36 are eliminated and the electrostatic chuck includes only a disc shaped metal electrode. If the workpiece is a dielectric, dielectric coating 38 may be eliminated.

The circuitry for electrically energizing electrostatic chuck 30 includes r.f. source 46 and floating DC power supply source 48. R.f. source 46 is connected to electrodes 32 and 34 by matching network 50 and DC blocking capacitors 51 and 53. Floating DC source 48 includes center tap 56, as well as positive and negative output terminals 52 and 54, respectively connected to ring electrode 34 and disc electrode 32. Source 48 is constructed so the voltages between center tap 56 and terminal 52 and between tap 56 and terminal 54 are equal, but of opposite relative polarity. Although it is usually desirable for the voltages at terminals 52 and 54 to be equally offset relative to the voltage at tap 56, this is not always the case. The voltage of center tap 56 is proportional to the peak r.f. voltage of disc electrode 32 relative to the ground voltage of the walls of chamber 10.

In order for chuck 30 to operate in the preferred manner, the clamping voltage for chuck 30 needs to be applied symmetrically with respect to any r.f. induced DC bias which builds up on workpiece 28. The excited plasma rectifies the r.f. bias applied to chuck 30 and rectifies the r.f. electric field induced in the plasma by coil 22 or other reactance that excites the plasma. Typically, both of sources 24 and 46 operate at a frequency of 13.56 MHz. The peak r.f. voltage of the plasma and, therefore, of electrode 32 of bipolar chuck 30 can be anywhere between tens to thousands of volts.

The r.f. induced DC bias on workpiece 28 on chuck 30 is typically negative and, depending on the processor and process configuration in chamber 10, is proportional to and a significant fraction of the peak r.f. voltage between the chuck and ground. The r.f. induced DC bias is in the range of tens of volts to thousands of volts. This voltage range is likely of the same order of magnitude as the DC clamping voltage applied to the chuck electrodes, which is typically in the range from about 500 volts to 2000 volts. Because these r.f. induced DC bias and applied DC clamping voltages are of the same order of magnitude, the presence of r.f. induced DC bias on the workpiece would constitute a significant perturbation on the clamping voltage applied by the chuck to the workpiece. If these perturbations are not compensated, deleterious effects may occur to the workpiece and/or chuck.

To control the voltages of chuck 30 for proper operation, electrode 32 is connected to voltage divider 58, which reduces the voltage of electrode 32 to a relatively low level that can be handled by conventional electronic circuit components. Typically, the r.f. peak voltage of electrode 32 can vary anywhere from about 50 volts to about 2 kilovolts relative to ground. Voltage divider 58 thus reduces the peak voltage of electrode 32 relative to ground to a level typically in the range of approximately 20 to 30 volts. The output voltage of voltage divider 58 is applied to a conventional r.f. peak detector, including a DC blocking capacitor, and a series and/or shunt diode. If a single series or shunt diode is provided, a DC return path is provided between one electrode of the diode and ground to compensate for load current drawn from an output terminal of the peak detector. The peak detector usually includes a low pass filter responsive to the rectified waveform resulting from the action of the series or shunt diode. If both series and shunt diodes are provided, the return resistance is not required because one diode passes DC current for the other diode. Because the prior art peak detectors employ only a single series diode, a single shunt diode or one series and one shunt diode, the voltage supplied to the peak detector is relatively low, as indicated.

Peak detector 60 derives a negative DC voltage that is directly proportional to the peak value of the r.f. voltage supplied to voltage divider 58 by electrode 32. In order for floating DC power supply source 48 to apply positive and negative DC voltages to electrodes 32 and 34 that are of the same order of magnitude as the peak r.f. voltage of electrode 32, it is necessary to appreciably increase the level of the DC output of peak detector 60.

One possible way of increasing the level of the DC output of detector 60 is to connect an input terminal of DC amplifier to the output of peak detector 60 and connect the amplifier output terminal to center tap 56. The gain of DC amplifier 62 must be appreciable to enable the correct DC voltage to be applied to center tap 56. However, a problem with such high gain DC amplifiers is that they are complex, expensive, require a high voltage power supply, may not accurately track high frequency outputs of peak detector 60 and may not be reliable.

Hence the use of DC amplifier 62 is not desirable. To obviate the need for DC amplifier 62, it is necessary to provide a peak detector capable of detecting the peak amplitude of r.f. voltages in excess of 1 kilovolt RMS, without unduly loading matching network 50 or the plasma in chamber 10 coupled to electrode 32. It is also necessary for the peak detector to follow amplitude changes of the peak r.f. voltage on a millisecond time scale. Conventional diode peak detectors do not have such criteria. Conventional diodes, that would have to be used in prior art r.f. peak detectors, and which are capable of handling 1 kilovolt, are slow and have considerable parasitic capacitance, causing current loading and thus are not suited to control electrostatic chuck voltages.

BRIEF DESCRIPTION OF THE INVENTION

These problems of the prior art DC amplifiers and peak detectors are resolved by a combination including a control circuit comprising an r.f. peak detecting circuit for deriving a DC voltage having an amplitude proportional to and on the same order of magnitude as the peak r.f. voltage of an electrostatic chuck of a vacuum plasma processor. The control circuit supplies an unamplified replica of the DC voltage derived by the peak detecting circuit to the chuck DC power supply source. The level of the DC power supply voltage applied to the chuck thus varies in response to variations in the amplitude of the replica of the DC voltage derived by the peak detecting circuit. The DC power supply voltage supplied to the chuck and the peak value of the r.f. voltage developed at the electrode have the same order of magnitude.

In accordance with another aspect of the invention, an r.f. excited vacuum plasma processor for processing a workpiece comprises an electrostatic chuck having at least one electrode for holding the workpiece in place. An r.f. bias source is coupled to the chuck so the at least one electrode develops a peak r.f. voltage over a wide amplitude range. A DC power supply source is connected to the chuck and an r.f. peak detecting circuit is coupled with the at least one electrode. The peak detecting circuit is included in a circuit for controlling the DC voltage applied by the chuck DC power supply source to the chuck. The r.f. peak detecting circuit derives a DC voltage having an amplitude proportional to and on the same order of magnitude as the peak r.f. voltage of said at least one electrode. The control circuit includes a DC connection having only passive elements between the peak detecting circuit and the DC power supply source so the level of the DC voltage applied by the DC power supply to the chuck varies in response to variations in the amplitude of the negative DC voltage derived by the peak detecting circuit. The DC power-supply voltage supplied to the chuck and the peak value of the r.f. voltage developed at the electrode have the same order of magnitude.

A further aspect of the invention relates to an r.f. excited vacuum plasma processor for processing a workpiece, wherein the processor comprises an electrostatic chuck having at least one electrode for holding the workpiece in place. An r.f. bias source is coupled to the chuck so the at least one electrode develops peak r.f. voltages over a wide amplitude range. A DC power supply source is connected to the chuck and an r.f. peak detecting circuit is coupled with the at least one electrode. The peak detecting circuit is included in a circuit for controlling the DC voltage applied by the DC power supply to the chuck. The r.f. peak detecting circuit includes at least several series connected diodes having electrodes polarized in the same direction. The r.f. peak detecting circuit derives a DC voltage having an amplitude proportional to the peak r.f. voltage of the at least one electrode and which is an estimate of the DC voltage of the workpiece. The control circuit supplies a replica of the DC voltage derived by the peak detecting circuit to the chuck DC power supply source so the level of the DC source, as applied to the chuck, is shifted in response to variations in the amplitude of the replica of the DC voltage derived by the peak detecting circuit. The peak detector diodes are arranged such that the DC power supply voltage supplied to the chuck and the peak value of the r.f. voltage developed at the electrode have the same order of magnitude. Because of this arrangement the chuck and workpiece float at about the same DC voltage.

According to one preferred embodiment, the peak detecting circuit includes only one stack of several series connected diodes having electrodes polarized in the same direction. In another embodiment, the peak detecting circuit includes two of these stacks. The diodes of one of the stacks are polarized in a first direction, while the diodes of the other stack are polarized in a second direction.

The invention is applicable to monopolar electrostatic chucks having only one electrode that is connected to one terminal of the chuck DC power supply source. In the monopolar chuck another terminal of the chuck DC power supply source is connected to the unamplified replica of the DC voltage.

The invention is also applicable to bipolar electrostatic chucks having opposite polarity first and second electrodes. In this case, the chuck DC power supply source has a floating terminal having a potential between the potentials of first and second opposite polarity DC terminals of the chuck DC power supply source. The opposite polarity DC terminals are respectively connected to the first and second electrodes. The floating terminal is connected by a DC path to the replica of the DC voltage derived by the peak detecting circuit.

The above and still further objects, features and advantages of the present invention will become apparent upon consideration of the following detailed descriptions of several specific embodiments thereof, especially when taken in conjunction with the accompanying drawings.

DETAILED DESCRIPTION OF THE DRAWING

Figure 1:
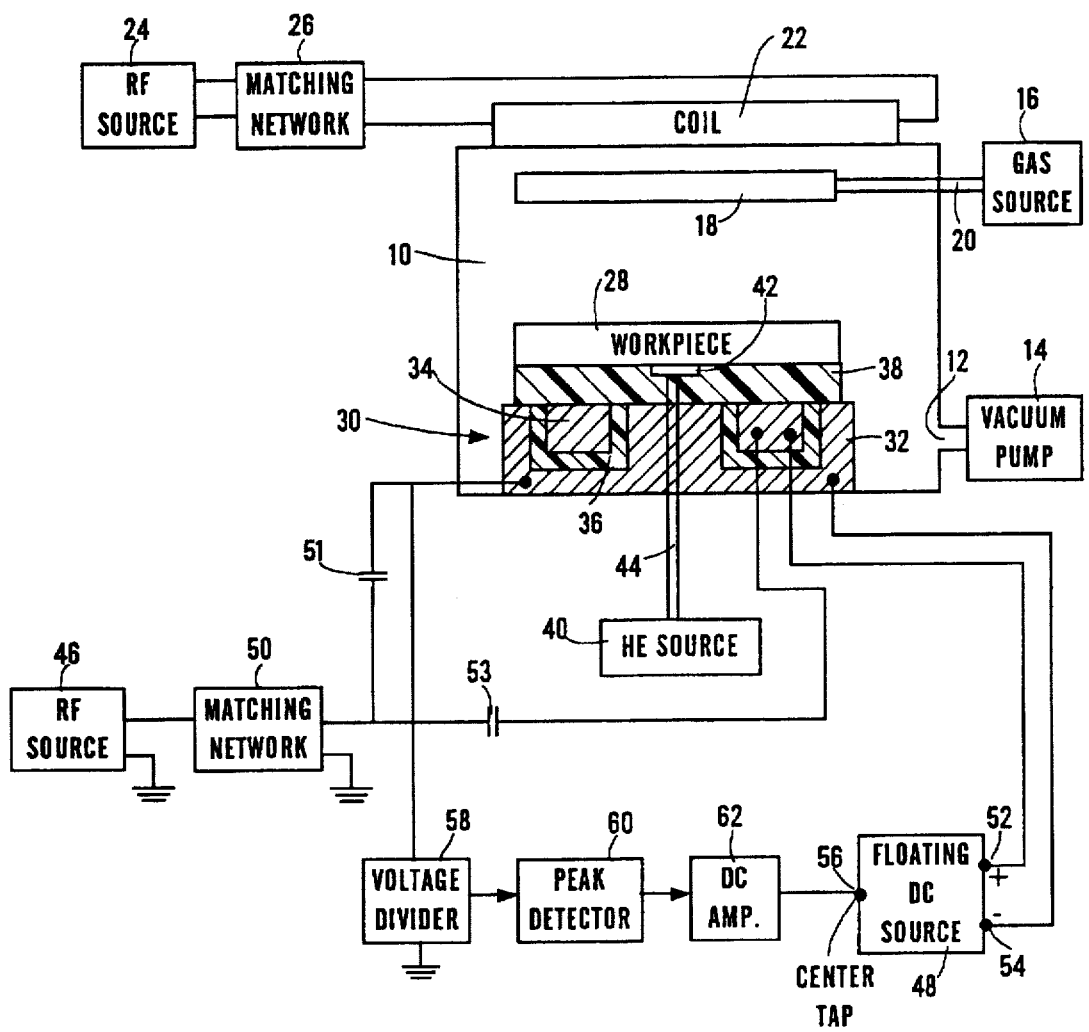
FIG. 1, as previously described, is a schematic diagram of a prior art r.f. excited vacuum plasma processor including an electrostatic chuck.
Figure 2:
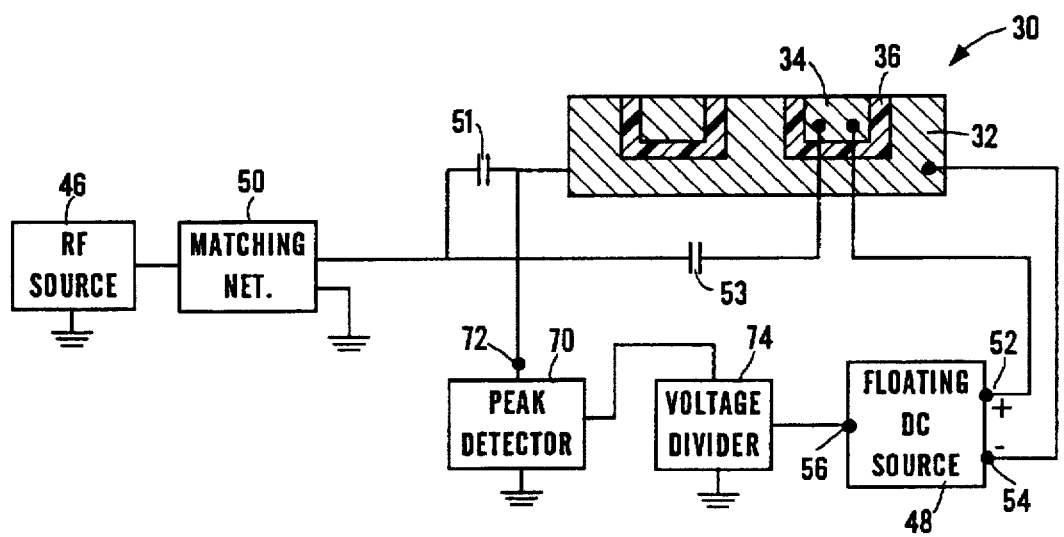
FIG. 2 is a schematic diagram of a bipolar electrostatic chuck in combination with circuit elements for applying voltages to the chuck in accordance with a preferred embodiment of the invention.
Figure 4:
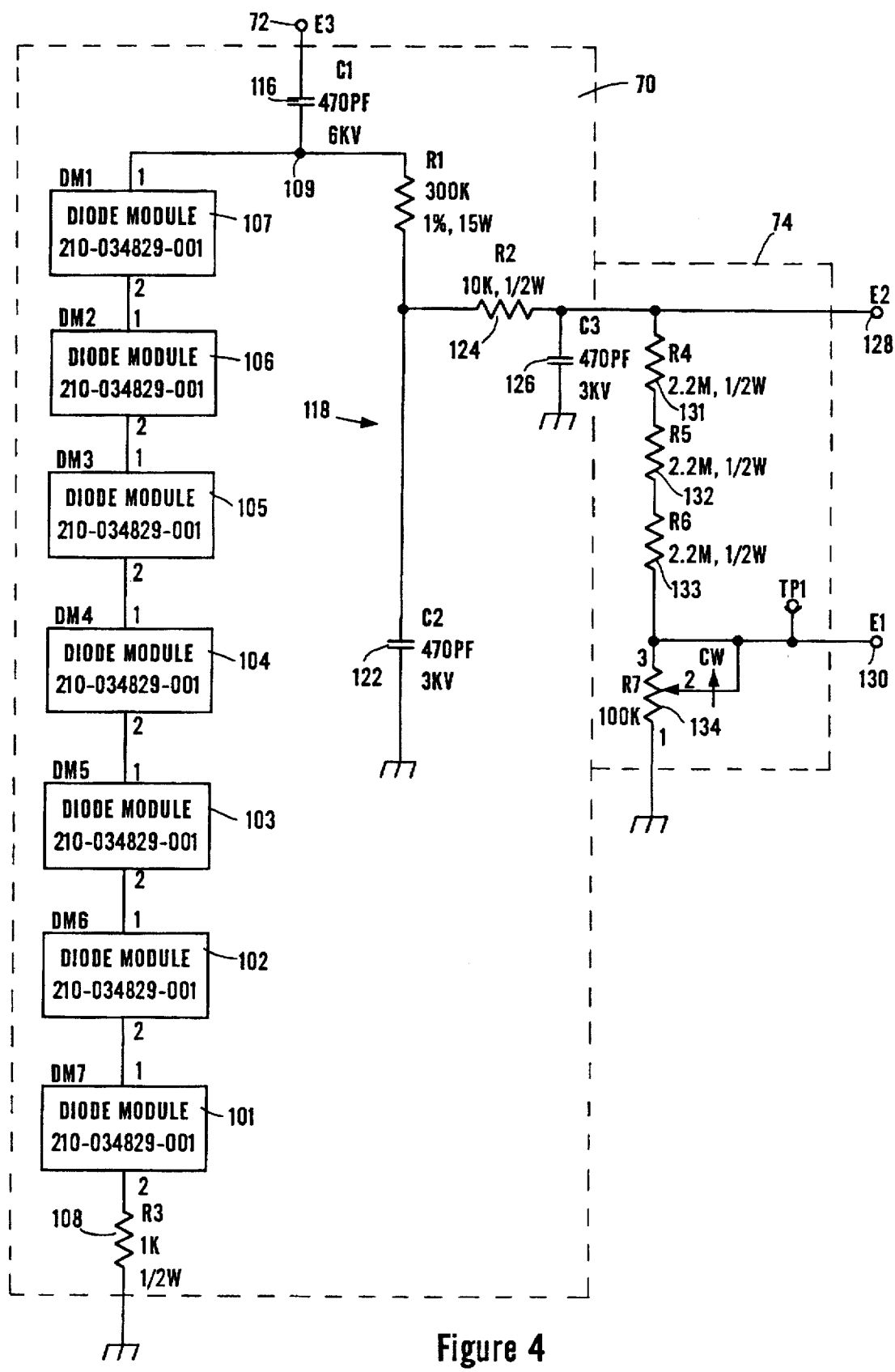
FIG. 4 is a circuit diagram of a preferred embodiment of the peak detector illustrated in FIGS. 2 and 3.
Figure 5:
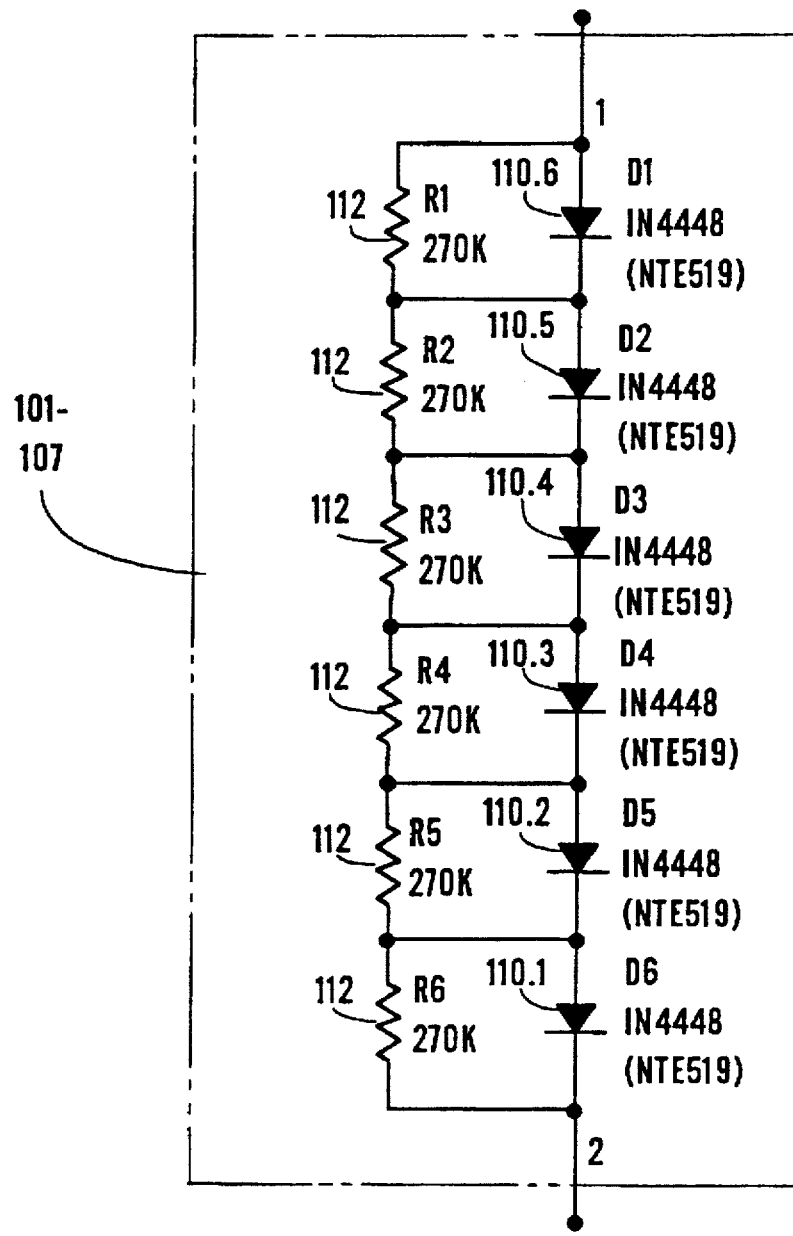
FIG. 5 is a circuit diagram of a diode module included in the circuit of FIG. 4.

Reference is now made to FIG. 2 of the drawing, wherein electrostatic chuck 30 is illustrated as including electrodes 32 and 34, connected to r.f. source 46 and floating DC source 48 in the same manner as illustrated in the prior art of FIG. 1. In the circuit of FIG. 2 the voltage supplied to center tap 56 of source 48 is derived by peak detector 70, the circuit diagrams of which are illustrated in FIGS. 4 and 5. Peak detector 70 is arranged to derive a DC voltage having an amplitude approximating the peak r.f. voltage of electrode 32. Thus, peak detector 70 derives a relatively high DC voltage having a value close to being directly proportional to and approximately equal to the magnitude of the r.f. peak voltage of electrode 32. Peak detector 70 is constructed and is made of components such that it can derive DC voltages directly proportional to the peak r.f. voltage applied to it, over a range of tens of volts to two or more kilovolts. Peak detector 70 does not unduly load the circuits connected to it, i.e., has a relatively high impedance between its input terminal 72 and ground, and is capable of following amplitude changes of the peak value of the r.f. voltage applied to it on millisecond time scales.

The DC output voltage of peak detector 70 is applied to terminal 56 via a DC path having only passive components, such that the DC voltage applied to tap 56 is an unamplified replica of the output voltage of the peak detector. To this end, the output of peak detector 70 is applied directly to tap 56 or is applied to the tap via resistive voltage divider 74, having an output terminal directly connected to tap 56. Because the DC path from the output of peak detector 70 to tap 56 includes only passive components and is an unamplified replica of the output of the peak detector, the problems of DC amplifier 62, FIG. 1, are not encountered.

Figure 3:
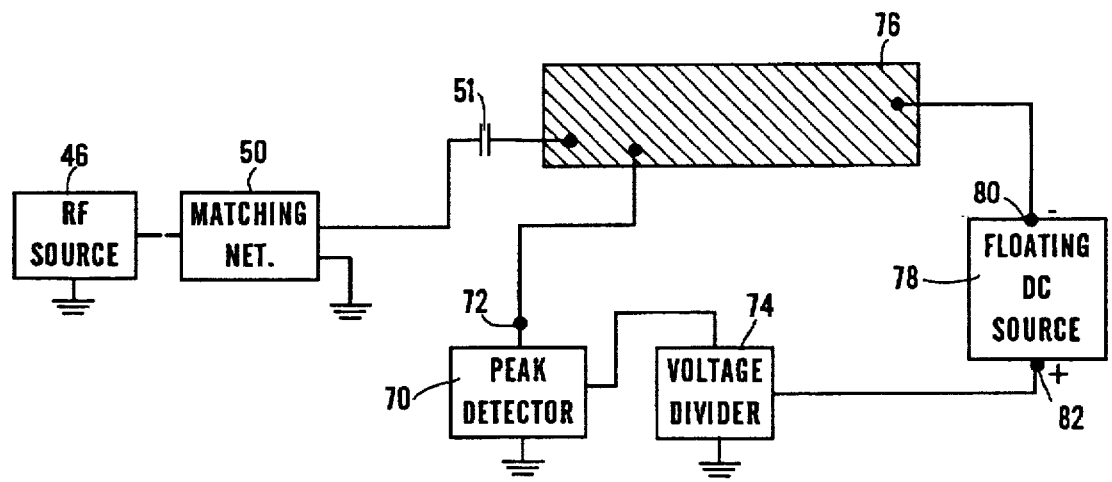
FIG. 3 is a schematic diagram of a monopolar chuck, in combination with circuit elements for driving the monopolar chuck in accordance with a preferred embodiment of the invention.

The invention is applicable to monopolar electrostatic chucks, as illustrated by electrode 76, FIG. 3. For the monopolar electrostatic chuck situation, electrode 76 is supplied with an r.f. bias by source 46 and matching network 50 in the same manner that electrode 32 of the bipolar electrostatic chuck is excited in the arrangement of FIGS. 1 and 2. In FIG. 3, peak detector 70 is connected to electrode 76 to supply a DC output voltage to floating chuck DC power supply source 78. Source 78 includes negative terminal 80, connected to electrostatic chuck electrode 76. In addition, floating DC source 78 includes positive terminal 82, connected to the output of voltage divider 74. Thereby, the positive terminal of floating DC source 78 is connected in a DC circuit to the DC output voltage of peak detector 70 via a path including only passive elements, so there is no amplification between the DC output of peak detector 70 and the positive terminal 82 of source 78.

Reference is now made to FIG. 4 of the drawing, a circuit diagram of a preferred embodiment of peak detector 70. Peak detector 70 includes seven series connected rectifier modules 101–107, connected in series with current limiting resistor 108, between terminal 109 and ground. Terminal 109 is AC coupled by DC blocking capacitor 116 to electrode 32 of electrostatic chuck 30, FIG. 2, or to electrode 76, FIG. 3.

As illustrated in FIG. 5, each of modules 101–107 is virtually identical and includes six virtually identical series connected r.f. diodes 110.1–110.6, preferably of any of the 1N4448, 1N4532 or 1N4148 type. All of the diodes in each of modules 101–107 are polarized in the same direction, so the anode of each diode is at a higher positive DC voltage than the cathode thereof. Hence, there are 42 diodes series connected between terminal 109 and ground, with the "top" diode 110.6 of module 107 being connected directly, in a DC path, to terminal 109 and the "bottom" diode 110.1 of module 101 having its anode connected to ground through resistor 108. In steady state, after capacitor 116 has been charged, a negative DC voltage responsive to the negative peaks of the r.f. voltage of electrode 32 is derived at terminal 109.

Each of diodes 110 is shunted by a separate relatively high value resistor 112, each having a value in excess of 10 kilohms and equal to 270 kilohms in the preferred embodiment. Shunt resistors 112 provide voltage division for the negative half cycles of the r.f. applied across peak detector 70 when series connected diodes 110 are back biased.

The negative DC voltage at terminal 109 is converted into a DC voltage close to being directly proportional to the peak value of the r.f. voltage at terminal 72 by low pass filter 118. Low pass filter 118 includes a first section comprising series resistor 120 and shunt capacitor 122. The voltage at tap 123, common to series resistor 120 and shunt capacitor 122, is applied to a second section of low pass filter 118, including series resistor 124 and shunt capacitor 126. The common terminal of resistor 124 and capacitor 126 is connected to one output terminal 128 of peak detecting circuit 70. Alternatively, the voltage at the common terminal of resistor 122 and capacitor 124 is coupled across the series combination of fixed resistors 131-133 and variable resistor 134, all of which are in a branch between output terminal 128 and ground. Variable resistor 134 includes output tap 136, which serves as an alternate output terminal of peak detector 70. A DC voltage is thus derived at terminal 128 which has an amplitude that is virtually the same as the negative peak voltage developed between terminal 109 and ground. If such a large DC voltage cannot be handled by the remainder of the apparatus, a lower voltage replica of the voltage at terminal 128 is derived at tap 136.

Because of the stacked diode arrangement of modules 101-107 and the effect of low pass filter 118, the DC voltage at terminal 128 or 136 is close to being directly proportional to the peak r.f. AC voltage at terminal 72. The DC voltage at terminal 128 thus has a value approximately equal to the peak value of the r.f. voltage coupled to terminal 72 for voltages in the range from approximately 50 volts to 2,000 volts. The voltages at both of terminals 128 and 136 accurately track the maximum r.f. voltage coupled to terminal 72 because of the high frequency characteristics of diodes 110 and the effects that shunt resistors 112 have on the voltages developed across the diodes and the currents which flow through the diodes. The voltage at terminal 136 is of the same order of magnitude as the peak r.f. voltage at terminal 72. As a result, the voltage of electrostatic chuck 30 and the r.f. plasma are of the same order of magnitude and deleterious effects of a substantial voltage difference between the chuck and plasma are overcome without using a DC amplifier with its attendant problems.

Each of diodes 110 is a physically small, high frequency diode with low parasitic capacitance, having a relatively low voltage breakdown. Because each of the diodes has a relatively low voltage breakdown, each module preferably includes six series connected diodes to withstand the voltage developed between terminal 109 and ground. The total of 42 low voltage, high frequency series connected diodes enables peak detector 70 to derive at terminal 128 a DC output voltage that is close to being directly proportional to the peak voltage of the r.f. voltage applied to terminal 72 and which is approximately equal to the peak r.f. voltage at terminal 72.

The series connection of diodes 110 has the additional advantage of optimal geometric construction to control and minimize parasitic capacitance so peak detector 70 can easily handle the r.f. voltage at terminal 72 without substantial loading. The 42 series connected diodes, each shunted by a 270 kilohm resistor, provide a shunt resistive impedance of 10.7 megohms and only draw about one-tenth of a milliampere for a peak r.f. voltage of 1 kilovolt. The standoff voltage of the aforementioned types of diodes is approximately 75 volts. Hence, the 42 stacked diodes 110 are capable of withstanding a voltage in excess of 3 kilovolts. The parasitic impedances of each of diodes 110 and each of resistors 112 are respectively approximately 2 pF and 0.5 pF. Each diode, resistor pair has about 1 pF stray capacitance. Therefore, each diode, shunt resistor combination has a total parasitic capacitance of approximately 3.5 pF. Because these 3.5 pF parasitic capacitances are in series with each other, the total parasitic capacitance of the 42 diode stack is approximately 0.085 pF.

While the series stacked arrangement of FIG. 3 is the preferred embodiment for peak detector 70, the peak detector can have other configurations. The 42 diodes 110 and the 42 resistors 112 shunting them could be connected in series between capacitor 116 and resistor 120. However, such an arrangement does not provide as accurate tracking of the peak r.f. voltage as the shunt arrangement of the 42 diodes as illustrated in FIG. 4.

Figure 6:
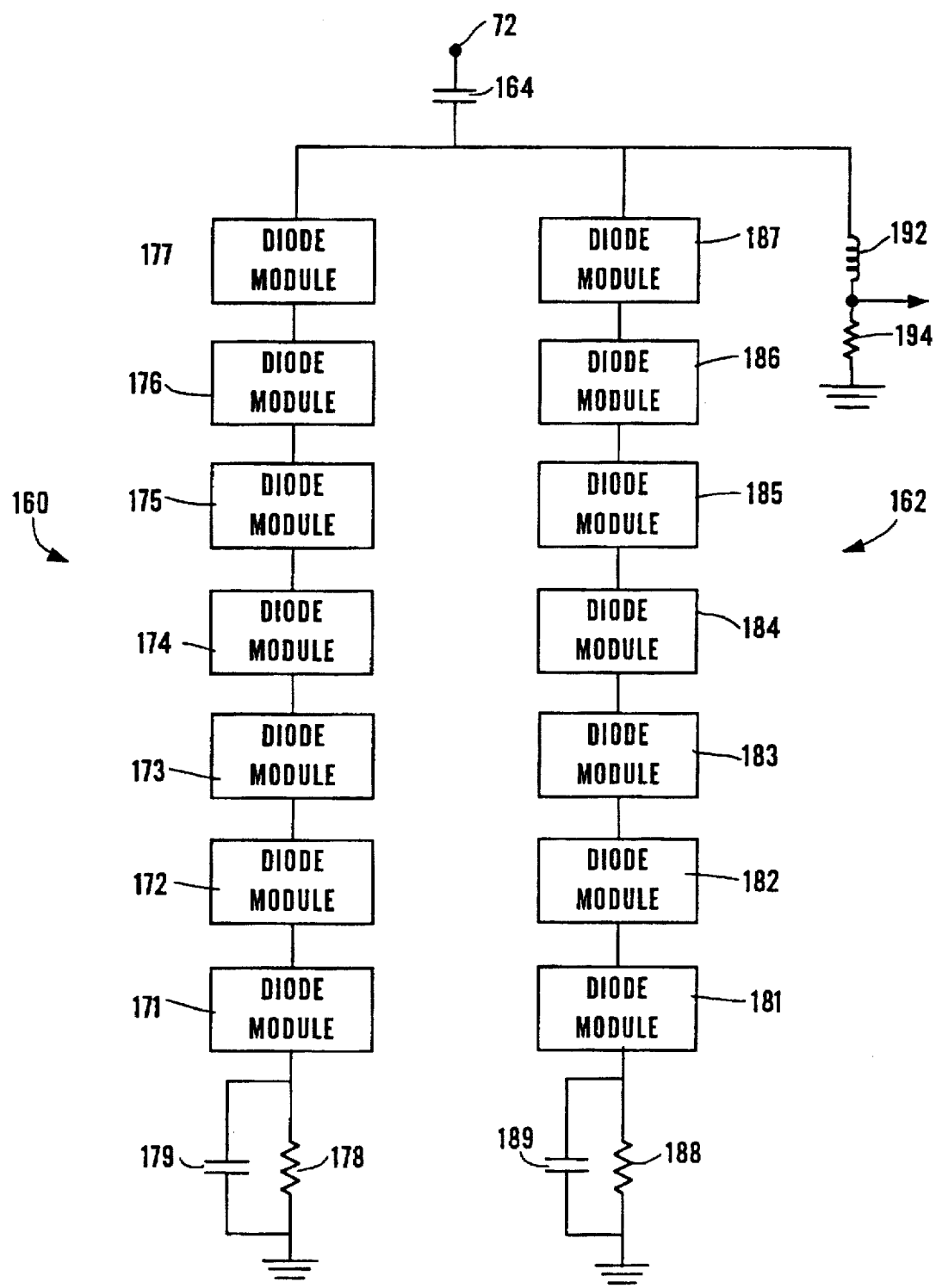
FIG. 6 is a circuit diagram of a further embodiment of a peak detector which can be used in connection with the present invention.

A further alternative is illustrated in FIG. 6 as including two different stacks 160 and 162 of diode modules, connected to terminal 72 via DC blocking and r.f. coupling capacitor 164. Each of stacks 160 and 162 includes seven series connected modules, each of which is identical to the module illustrated in FIG. 5. Diode modules 171-177 of stack 160 are series connected to each other and module 171 is connected to ground via the parallel combination of resistor 178 and capacitor 179. All of the diodes of modules 171-177 are polarized in the same direction, such that the anode of the "top" diode 110.6 in module 177 is connected to one electrode of capacitor 164 and the cathode of the "bottom" diode 110.1 of module 171 is connected to resistor 178 and capacitor 179. Stack 162 includes diode modules 181-187, connected in series with each other. Module 181 is connected to the parallel combination of resistor 188 and capacitor 189 to ground. The diodes of modules 181-187 are connected in series with each other, but are polarized in a direction opposite from the diodes of modules 171-177. Thus, the cathode of the "bottom" diode 110.1 of module 187 is connected to capacitor 164, while the anode of the "top" diode 110.6 of module 181 is connected to resistor 188 and capacitor 189.

The networks including resistors 178 and 188 and capacitors 179 and 189 provide some low pass filtering for the currents flowing through the diodes of diode module stacks 160 and 162. Further low pass filtering of the peak voltages detected by the diode modules of stacks 160 and 162 is provided by the series combination of inductor 192 and resistor 194. A DC output voltage developed at the common terminal of inductor 192 and resistor 194 is directly proportional to the peak r.f. voltage applied to terminal 72. The DC voltage developed across resistor 194 can be applied directly to tap 56 of chuck DC power supply source 48 (FIG. 2) or terminal 82 of chuck DC power supply source 78 (FIG. 3); alternatively, the DC voltage developed across resistor 194 can be applied to chuck DC power supply sources 48 or 78 via a voltage divider, such as the voltage divider including resistors 131-134, FIG. 4.

The circuit of FIG. 6 is basically a shunt/series circuit having symmetrical loading to prevent charging of DC blocking capacitor 164. The resistive paths to ground through the diode modules of stacks 160 and 162, as well as through resistors 178 and 188, provide DC restoration. While the circuit of FIG. 6 functions admirably, it is somewhat expensive because it requires two diode stacks. In addition, the space requirements for the 84 diodes of modules 171-177 and 181-187 are considerable. The performance of the circuit of FIG. 4 is approximately the same as that of FIG. 6, without the additional expense of a second diode stack and without the space requirements of 84 diodes and the shunt resistors associated with them.

While there have been described and illustrated several specific embodiments of the invention, it will be clear that variations in the details of the embodiments specifically illustrated and described may be made without departing from the true spirit and scope of the invention as defined in the appended claims.

We claim:

1. An r.f. excited vacuum plasma processor for processing a workpiece, comprising an electrostatic chuck having at least one electrode for holding the workpiece in place, an r.f. bias source connected to the chuck so the at least one electrode develops peak r.f. voltages over a wide amplitude range, a chuck DC power supply source connected to the chuck, an r.f. peak detecting circuit coupled with said at least one electrode, the peak detecting circuit being included in a circuit for controlling the DC voltage applied by the chuck DC power supply source to the chuck, the r.f. peak detecting circuit deriving a DC voltage having an amplitude approximately proportional to and on the same order of magnitude as the peak r.f. voltage of said at least one electrode, the control circuit supplying an unamplified replica of the DC voltage derived by the peak detecting circuit to the chuck DC power supply source so the level of the DC voltage applied by the chuck DC power supply source to the chuck varies in response to variations in the amplitude of the replica of the DC voltage derived by the peak detecting circuit, the DC voltage supplied by the chuck DC power supply source to the chuck and the peak value of the r.f. voltage developed at the electrode having the same order of magnitude.

2. The processor of claim 1 wherein the peak detector includes at least several series connected diodes having electrodes polarized in the same direction.

3. The processor of claim 2 wherein said several series connected diodes having electrodes polarized in the same direction are connected in a stack between an input terminal of the peak detector and ground and are shunted by a low pass filter coupled to one terminal of said chuck DC power supply source.

4. The processor of claim 3 wherein the peak detecting circuit includes only one of said stacks.

5. The processor of claim 3 wherein the peak detecting circuit includes two of said stacks, the diodes of one of said stacks being polarized in a first direction, the diodes of the other of said stacks being polarized in a second direction.

6. The processor of claim 1 wherein the electrostatic chuck is a monopolar chuck having only one electrode, said one electrode being connected to one terminal of said chuck DC power supply source, another terminal of said chuck DC power supply source being DC connected to a terminal where the unamplified replica of the DC voltage is derived.

7. The processor of claim 1 wherein the electrostatic chuck is a bipolar chuck having opposite polarity first and second electrodes, the chuck DC power supply source having a floating terminal having a potential between the potentials of first and second opposite polarity DC terminals respectively connected to the first and second electrodes, the floating terminal being connected by a DC path to a terminal where the replica of the DC voltage derived by the peak detecting circuit is derived.

8. The processor of claim 1 wherein the control circuit includes a DC connection having only passive elements between the peak detecting circuit and the chuck DC power supply source.

9. An r.f. excited vacuum plasma processor for processing a workpiece, comprising an electrostatic chuck having at least one electrode for holding the workpiece in place, an r.f. bias source connected to the chuck so the at least one electrode develops peak r.f. voltages over a wide amplitude range, a chuck DC power supply source connected to the chuck, an r.f. peak detecting circuit coupled with said at least one electrode, the peak detecting circuit being included in a circuit for controlling the DC voltage applied by the chuck DC power supply source to the chuck, the r.f. peak detecting circuit deriving a DC voltage having an amplitude approximately proportional to and on the same order of magnitude as the peak r.f. voltage of said at least one electrode, the control circuit including a DC connection having only passive elements between the peak detecting circuit and the chuck DC power supply source so the level of the DC voltages applied by the chuck DC power supply to the chuck varies in response to variations in the amplitude of the DC voltage derived by the peak detecting circuit, the DC voltage supplied by the chuck DC power supply to the chuck and the peak value of the r.f. voltage developed at the electrode having the same order of magnitude.

10. The processor of claim 9 wherein the peak detector includes at least several series connected diodes having electrodes polarized in the same direction.

11. The processor of claim 10 wherein said several series connected diodes having electrodes polarized in the same direction are connected in a stack between an input terminal of the peak detector and ground and are shunted by a low pass filter coupled to one terminal of said chuck DC power supply source.

12. The processor of claim 11 wherein the peak detecting circuit includes only one of said stacks.

13. The processor of claim 11 wherein the peak detecting circuit includes two of said stacks, the diodes of one of said stacks being polarized in a first direction, the diodes of the other of said stacks being polarized in a second direction.

14. The processor of claim 9 wherein the electrostatic chuck is a monopolar chuck having only one electrode, said one electrode being connected to one terminal of said chuck DC power supply source, another terminal of said chuck DC power supply source being DC connected to a terminal where the unamplified replica of the DC voltage is derived.

15. The processor of claim 9 wherein the electrostatic chuck is a bipolar chuck having opposite polarity first and second electrodes, the chuck DC power supply source having a floating terminal having a potential between the potentials of first and second opposite polarity DC terminals respectively connected to the first and second electrodes, the floating terminal being connected by a DC path to a terminal where the replica of the DC voltage derived by the peak detecting circuit is derived.

16. An r.f. excited vacuum plasma processor for processing a workpiece, comprising an electrostatic chuck having at least one electrode for holding the workpiece in place, an r.f. bias source connected to the chuck so the at least one electrode develops peak r.f. voltages over a wide amplitude range, a chuck DC power supply source connected to the chuck, an r.f. peak detecting circuit coupled with said at least one electrode, the peak detecting circuit being included in a circuit for controlling the DC bias applied by the chuck DC power supply source to the chuck, the r.f. peak detecting circuit including at least several series connected diodes having electrodes polarized in the same direction and deriving a DC voltage having an amplitude approximately proportional to the peak r.f. voltage of said at least one electrode, the control circuit supplying a replica of the DC voltage derived by the peak detecting circuit to the chuck DC power supply source so the level of the DC voltage applied by the chuck power supply source to the chuck varies in response to variations in the amplitude of the replica of the DC voltage derived by the peak detecting circuit, the diodes of the peak detecting circuit being arranged so the DC voltage supplied by the chuck power supply source to the chuck and the peak value of the r.f. voltage developed at the electrode have the same order of magnitude.

17. The processor of claim 16 wherein said several series connected diodes having electrodes polarized in the same direction are connected in a stack between an input terminal of the peak detector and ground and are shunted by a low pass filter coupled to one terminal of said chuck DC power supply source.

18. The processor of claim 17 wherein the peak detecting circuit includes only one of said stacks.

19. The processor of claim 17 wherein the peak detecting circuit includes two of said stacks, the diodes of one of said stacks being polarized in a first direction, the diodes of the other of said stacks being polarized in a second direction.

20. The processor of claim 16 wherein the electrostatic chuck is a monopolar chuck having only one electrode, said one electrode being connected to one terminal of said chuck DC power supply source, another terminal of said chuck DC power supply source being DC connected to a terminal where the unamplified replica of the DC voltage is derived.

21. The processor of claim 16 wherein the electrostatic chuck is a bipolar chuck having opposite polarity first and second electrodes, the chuck DC power supply source having a floating terminal having a potential between the potentials of first and second opposite polarity DC terminals respectively connected to the first and second electrodes, the floating terminal being connected by a DC path to a terminal where the replica of the DC voltage derived by the peak detecting circuit is derived.

* * * * *